(12) United States Patent
Young et al.

(10) Patent No.: US 10,554,204 B1
(45) Date of Patent: Feb. 4, 2020

(54) LOAD BYPASS SLEW CONTROL TECHNIQUES

(71) Applicant: Analog Devices, Inc., Norwood, MA (US)

(72) Inventors: Eric Stephen Young, Apex, NC (US); Xin Qi, Cary, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/227,988

(22) Filed: Dec. 20, 2018

(51) Int. Cl.
*H03K 17/16* (2006.01)
*H05B 33/08* (2006.01)
*G05F 3/26* (2006.01)
*H03K 7/08* (2006.01)

(52) U.S. Cl.
CPC ............ *H03K 17/162* (2013.01); *G05F 3/265* (2013.01); *G05F 3/267* (2013.01); *H03K 7/08* (2013.01); *H05B 33/0812* (2013.01)

(58) Field of Classification Search
CPC .... H03K 17/162; H03K 7/08; H05B 33/0812; G05F 3/265; G05F 3/267
See application file for complete search history.

(56) References Cited

U.S. PATENT DOCUMENTS

| | | | |
|---|---|---|---|
| 9,614,517 B2 | 4/2017 | Krishna | |
| 2011/0273102 A1* | 11/2011 | van de Ven | H05B 33/0809 |
| | | | 315/193 |
| 2011/0285321 A1* | 11/2011 | Li | H05B 33/0827 |
| | | | 315/307 |
| 2013/0278157 A1* | 10/2013 | Radermacher | H05B 33/0812 |
| | | | 315/186 |
| 2014/0210446 A1* | 7/2014 | Kung | H02M 1/36 |
| | | | 323/284 |
| 2017/0126223 A1* | 5/2017 | Imai | H01L 27/0635 |

OTHER PUBLICATIONS

Szolusha, Keith, et al., "One LED Driver Is All You Need for Automotive LED Headlight Clusters", LT Journal of Analog Innovation, (Jul. 2015), 5 pgs.
Szolusha, Keith, "Single 2MHz Buck-Boost Controller Drives Entire LED Headlight Cluster, Meets CISPR 25 Class 5 EMI", Power by Linear Journal of Power Management, (Jan. 2018), 6 pgs.

* cited by examiner

*Primary Examiner* — Raymond R Chai
(74) *Attorney, Agent, or Firm* — Schwegman Lundberg & Woessner, P.A.

(57) ABSTRACT

Techniques for an integrated slew-rate control circuit are provided. In certain examples, an adjustable, integrated slew-rate control circuit for a bypass transistor can provide three decades of adjustability. In an example, a slew-rate control circuit can include a load bypass transistor, a slew-rate control capacitor, electrically coupled between a conduction node of the load bypass transistor and a control node of the load bypass transistor, and a current mirror circuit. The current mirror circuit can include a sense transistor electrically coupled in series with the slew-rate control capacitor and the control node, and a mirror transistor electrically coupled between a power supply and the control node, to selectively provide, to or from the control node, a shunt current that bypasses the slew-rate control capacitor to limit a slew rate of a voltage at the conduction node.

20 Claims, 6 Drawing Sheets

LOAD BYPASS SLEW CONTROL TECHNIQUES

TECHNICAL FIELD

The present disclosure discusses load current control techniques, and more particularly, slew-rate control techniques for load bypass transistors.

BACKGROUND

Load bypass switching is a technique for placing a bypass switch in parallel with a load so that current (i.e., power) can be diverted around the load without interrupting the current. Slew rate is defined as the time rate of change of voltage across the bypass switch. A practical use of load bypass switching is pulse width modulation dimming of light-emitting diodes (LEDs). LEDs can be connected in series so that the same current flows in each LED, and thus, can ensure a matched light output. The light from an individual LED, or a multi-LED segment, can be extinguished for dimming purposes by actuating a switch in parallel with one or more of the LEDs to divert the current around that portion of the series-connected LEDs. A popular name for this technique is matrix LED dimming. Often, LED drivers regulate the current to the LEDs and not the voltage. When portions of the LED load are bypassed, the voltage across the overall load can change even as the current stays the same. Because the matrix dimming can generate voltage steps, there are situations where slew-rate control during the switch turn-on and turn-off transitions can ameliorate light intensity fluctuations that otherwise occur with the voltage steps. Slew-rate control can allow time to charge and discharge a storage capacitor across the LED string. For switch-mode DC/DC power converters that produce discontinuous current pulses, an output storage capacitor can filter or smooth current delivery to the load. A "boost" or step-up converter is a type of DC/DC converter that often uses an output storage capacitor.

Significant fluctuation of current in LEDs, as well as other types of loads, due to bypass switching events, can cause voltage or current spikes that can disrupt operation of the load, cause flicker in an LED load, or possibly damage the load due to electrical overstress. Conventional techniques to limit the voltage slew rate in bypass switching applications can add an integrating capacitor between a control node and a switched node (e.g., drain) of a bypass transistor. This capacitor is often referred to as a Miller capacitor. In addition, conventional techniques also charge or discharge the gate of the bypass transistor with a fixed current. When the bypass transistor is at the turn-on or turn-off threshold, current can begin to flow via the Miller capacitor to counteract the charging or discharging of the control node of the bypass transistor and thus provide a slew rate dependent on the capacitance value of the Miller capacitor.

The conventional techniques have a number of drawbacks. One drawback is that the slew rate is not adjustable once the Miller capacitor and the control node charging current are set. A second drawback is that the Miller capacitor adds to the overall capacitance on the control node, even when the control node is not at the turn-on or turn-off threshold and is not providing the benefit of bypass switch voltage slew-rate control. The additional capacitance can lead to unintentionally long delays in placing the control node at the threshold voltage when coupled with smaller charging and discharging currents. A third drawback is that an acceptable Miller capacitance to achieve adequate slew-rate control for a system including a boost-type switch mode converter can be impractically large to be an on-chip, integrated circuit element, or the charging/discharging current impractically small such that the charging/discharging current can be overwhelmed by junction leakage currents. Implementations of conventional slew rate techniques typically limit slew rates to 5V/µs for an integrated Miller capacitor. Slower slew rates often require use of a discrete external capacitor.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have identified slew-rate control techniques that allow for a small capacitor that can be integrated, on-chip, in a small integrated slew-rate control circuit, and to act like a much larger capacitor. In addition, the amplified capacitive effect generated by the slew-rate control techniques manifests when a bypass transistor is operating in a region susceptible to generating large current changes, and subsequently large voltage changes, across a corresponding load. At other times, the unamplified capacitance value of the small capacitor can control voltage slew across the conduction nodes of the bypass transistor. The present techniques can provide a strong charging or discharging current for the control node of the bypass transistor such that leakage currents do not overwhelm the slew-rate control. Also, the slew rate can be easily adjustable. For example, an integrated-circuit, adjustable, slew-rate control circuit, as described herein, can provide up to three decades of slew rate magnitude range (e.g., from 1V/1 µs to 1V/1000 µs), such as can help accommodate different DC/DC converter power stages with different bandwidths.

Figure 1:
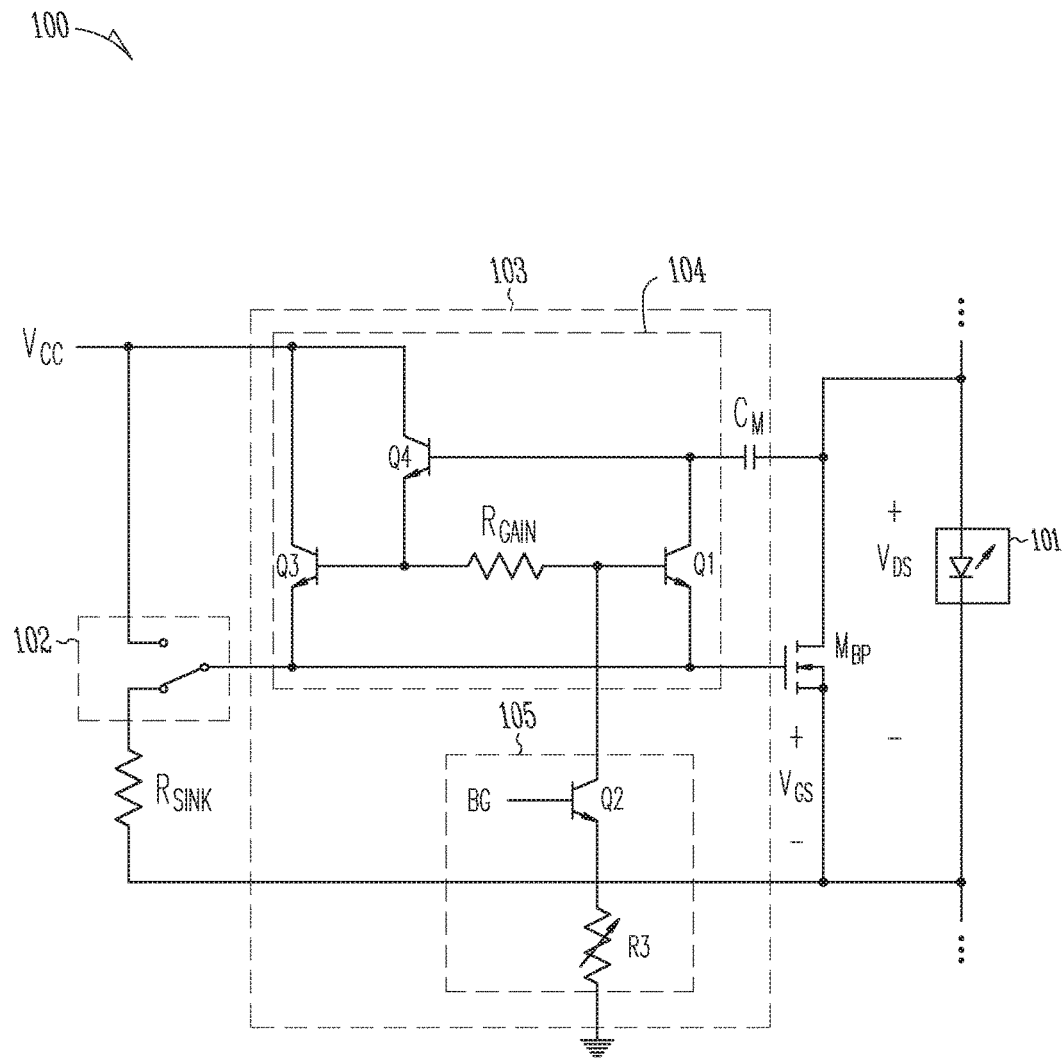
FIG. 1 illustrates generally an example bypass system having adjustable slew-rate control according to the present subject matter.

FIG. 1 illustrates generally an example bypass system 100 having adjustable slew-rate control according to the present subject matter. The system 100 can include a bypass transistor ($M_{BP}$), a load 101, a bypass control switch 102, and an example slew-rate control circuit 103. For illustrative clarity, slew-rate control is implemented on only one transition of the bypass transistor ($M_{BP}$). In certain examples, the load 101 can be part of several series connected devices and can be supplied by a first supply voltage ($V_D$) (not shown). In some examples, the load 101 can be a single device. The bypass control switch 102 can be responsive to an external signal and can control a logical state of the control node of the bypass transistor ($M_{BP}$). In some examples, the external signal can be a pulse-width-modulated (PWM) signal. In the illustrated example, in a first state, the bypass control switch 102 can couple the gate of the bypass transistor ($M_{BP}$) to a second supply voltage ($V_{CC}$) to enable the bypass transistor ($M_{BP}$) and divert current from the load 101. In a second state, the bypass control switch 102 can couple the gate of the bypass transistor ($M_{BP}$) to a conduction node of the bypass transistor ($M_{BP}$) to disable the bypass transistor ($M_{BP}$) and allow current to flow through the load 101. However, the transition of the bypass transistor ($M_{BP}$) to the second state via the bypass control switch 102 is subject to slew-rate control of the voltage ($V_{DS}$) across the conduction nodes of the bypass transistor ($M_{BP}$).

The slew-rate control circuit 103 can include a slew-rate control capacitor ($C_M$), a current mirror 104, a current-limiting discharge resistor ($R_{SINK}$), and a current source 105. In general, when the bypass control switch 102 transitions from the first state to the second state, the slew-rate control circuit 103 limits the rate at which the control node of the bypass transistor ($M_{BP}$) is discharged as the voltage at the control node of the bypass transistor ($M_{BP}$) traverses a region of operation where the resistance of the bypass transistor ($M_{BP}$) across the load 101 changes significantly.

In the illustrated example of FIG. 1, the bypass transistor ($M_{BP}$) can include an NMOS-type field effect transistor and includes a control node, or gate, and first and second conduction nodes, a source and drain, coupled across the load 101. The slew-rate control capacitor ($C_M$) can be coupled to the gate of the bypass transistor ($M_{BP}$) via a sense transistor (Q1) of the current mirror 104. In the second state of the bypass control switch 102, the bypass control switch 102 can couple the gate of the bypass transistor ($M_{BP}$) to the source of the bypass transistor ($M_{BP}$) via the current limiting resistor ($R_{SINK}$). Upon a first coupling of the gate of the bypass transistor ($M_{BP}$) to the current limiting resistor ($R_{SINK}$), the gate voltage and thus the gate-to-source voltage ($v_{gs}$) of the bypass transistor ($M_{BP}$) can begin to fall toward the threshold voltage ($v_t$) of the bypass transistor ($M_{BP}$) and the slew-rate control capacitor ($C_M$) can begin to charge. As the gate-to-source voltage ($v_{gs}$) of the bypass transistor ($M_{BP}$) approaches the threshold voltage ($v_t$) of the bypass transistor ($M_{BP}$), the slew-rate control capacitor ($C_M$) can begin to conduct current to the gate of the bypass transistor ($M_{BP}$) via the sense transistor (Q1) of the current mirror 104. In the illustrated example, as the gate of the bypass transistor ($M_{BP}$) is pulled lower and the base of the sense transistor (Q1) follows, the base of the sense resistor (Q1) can approach certain voltage drop below the node that couples the slew-rate capacitor ($C_M$) to the sense transistor (Q1), and the sense transistor (Q1) can begin to turn on and conduct current of the slew-rate control capacitor ($C_M$). This current of the slew-rate control capacitor ($C_M$) can act to slew-rate limit the voltage change between the conduction nodes of the bypass transistor ($M_{BP}$). In the illustrated example, the certain voltage drop discussed above is the sum of the forward bias voltage of the base-emitter junction of the sense transistor (Q1), the forward bias voltage of the base-emitter junction of the "beta-helper" transistor (Q4), and the voltage drop across the gain resistor ($R_{GAIN}$)

The current mirror 104, via a mirror transistor (Q3), can amplify the effect of the slew-rate control capacitor ($C_M$) by amplifying the current of the sense transistor (Q1) to further slew-rate limit the voltage change between the conduction nodes of the bypass transistor ($M_{BP}$). The current provided by the mirror transistor (Q3) of the current mirror 104 can more strongly counteract the discharge of the gate node of the bypass transistor ($M_{BP}$), and can thus help further slew-rate limit the voltage change between the conduction nodes of the bypass transistor ($M_{BP}$). The gain of the current mirror 104 can be set or programmed (via the relative sizes of the sense transistor (Q1) and the mirror transistor (Q3), and via a control node offset between the control node of the sense transistor (Q1) and the control node of the mirror transistor (Q3)).

In certain examples, the control node offset voltage between the control node of the sense transistor (Q1) and the control node of the mirror transistor (Q3) can be produced via a second resistor ($R_{GAIN}$), such as in cooperation with the current source 105 (in this document the term "current source" is understood to include a "current sink"). The second resistor ($R_{GAIN}$) can couple the control node of the source transistor (Q1) with the control node of the mirror transistor (Q3). The current source 105 can be configured to allow the base-emitter voltage (Vbe) of the sense transistor (Q1) to be programmed. The current source 105 can include a third resistor (R3) coupled in series with a current source transistor (Q2). The current source 105 can be connected between the control node of the sense transistor (Q1) and a reference voltage such as ground. The current source transistor (Q2) can have a control node coupled to a stable voltage reference, such as a band-gap reference (BG). In certain examples, the third resistor (R3) can be variable to allow programming of the control node offset voltage via the current of the current source 105. In certain examples, a linear change in the resistance of the third resistor (R3) can provide an exponential change in the current mirror gain. The ability to vary the control node offset voltage via a variable resistor (e.g., the third transistor (R3)) can allow the slew-rate of the bypass transistor ($M_{BP}$) to be easily varied or adjusted.

As shown, the current mirror 104 can include a current-gain boosting "beta-helper" transistor (Q4). The beta-helper transistor (Q4) can have its conduction nodes respectively coupled to a supply voltage ($V_{CC}$) of the slew-rate control circuit and to the control node of the mirror transistor (Q3). The control node of the beta-helper transistor (Q4) can be coupled to the slew-rate control capacitor ($C_M$) and to the control node of the bypass transistor ($M_{BP}$) via the sense transistor (Q1). The beta-helper transistor (Q4) can provide control node current for the sense and mirror transistors (Q1, Q3) of the current mirror 104 so that switched current of the sense transistor (Q1) can equal discharge current of the slew-rate control capacitor ($C_M$).

Figure 2:
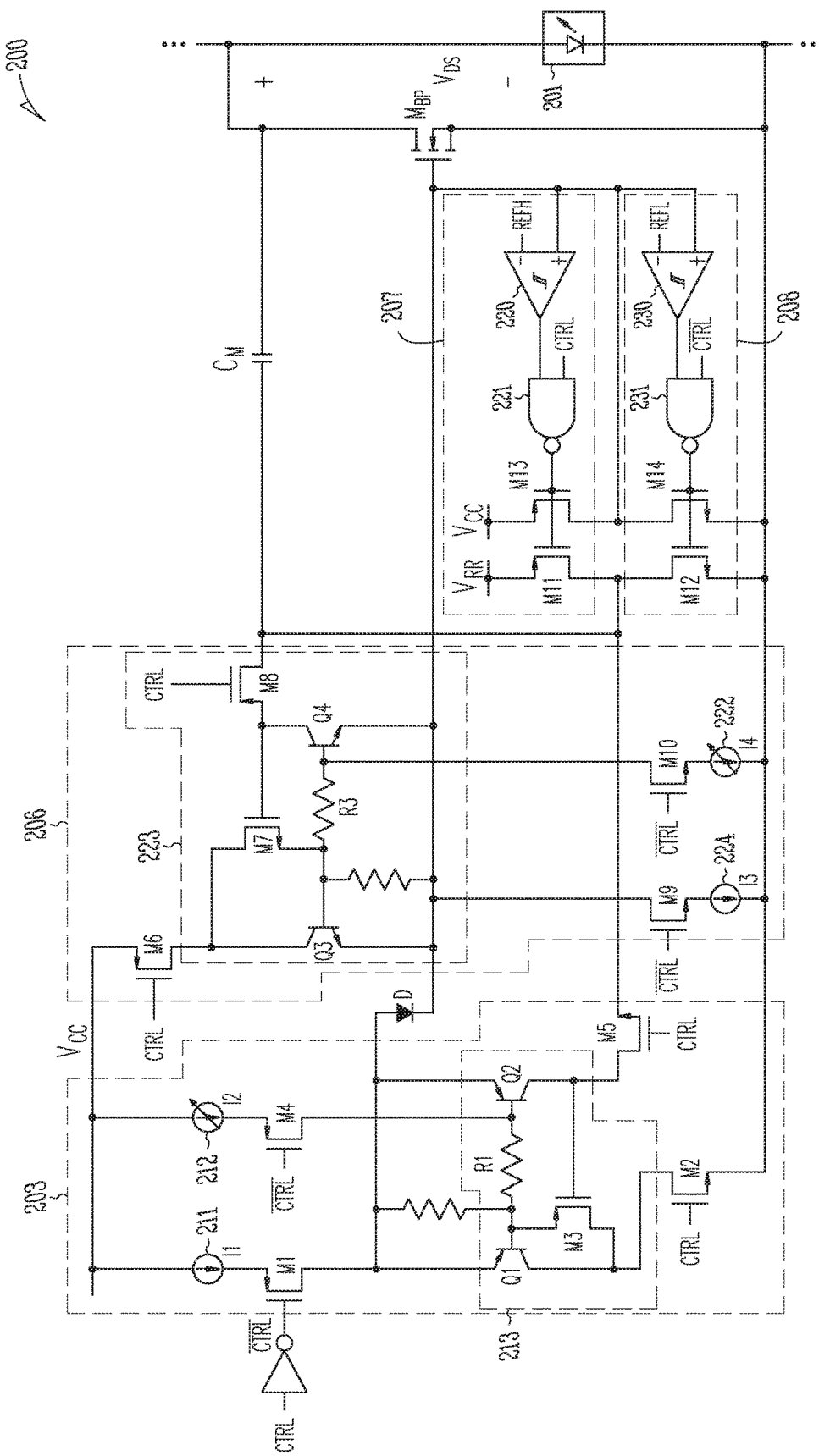
FIG. 2 illustrates an example bypass transistor circuit including example slew-rate control for transitions of the bypass transistor ($M_{BP}$) from a high-impedance state to a low impedance state and vice-versa.

FIG. 2 illustrates an example bypass transistor circuit 200 including example slew-rate control circuitry for bidirectional slew-rate-controlled transitions of the bypass transistor ($M_{BP}$) from a high-impedance state to a low-impedance state and vice-versa. The bypass transistor circuit 200 can include a bypass transistor ($M_{BP}$) coupled to a load 201, a slew-rate control capacitor ($C_M$), a first slew-rate control circuit 203, a second slew-rate control circuit 206, a gate diode (D), and first and second latch circuits 207, 208. A control signal (CTRL) for enabling and disabling the bypass transistor ($M_{BP}$) can be received by the bypass transistor circuit 200 and can be distributed as discussed below. The control signal (CTRL) can be received from a controller circuit. In certain examples, the controller circuit can be configured to control hot-swap events, LED dimming, heads-up displays, power controllers, or combinations thereof. It is to be understood that different logic levels and different types of transistors can be used for various devices in the example bypass transistor circuit 200 without departing from the scope of the present subject matter. For purposes of this discussion, when the bypass transistor ($M_{BP}$) is enabled (CTRL="high"), the impedance between the conduction nodes of the bypass transistor ($M_{BP}$) is intended to be very low, and when the bypass transistor ($M_{BP}$) is disabled (CTRL="low"), the impedance between the conduction nodes of the bypass transistor ($M_{BP}$) is intended to be very high.

The first slew-rate control circuit 203 can control the slew rate of the voltage across the conduction nodes of the bypass transistor ($M_{BP}$) as the bypass transistor ($M_{BP}$) transitions from being disabled to being enabled. The second slew-rate control circuit 206 can control the slew rate of the voltage across the conduction nodes of the bypass transistor ($M_{BP}$) as the bypass transistor ($M_{BP}$) transitions from being enabled to being disabled. Once the slew rate of the voltage across the conduction nodes of the bypass transistor ($M_{BP}$) has been controlled, the first latch circuit 207 or the second latch circuit 208 can latch the control node of the bypass transistor ($M_{BP}$) to a corresponding voltage level to fully enable or fully disable the bypass transistor ($M_{BP}$).

In certain examples, the first slew-rate control circuit 203 can include a gate charge current source 211, a slew-rate control current source 212, and a current mirror 213. The first slew-rate control circuit 203 can be enabled when the control signal (CTRL) goes to an "enable" or "high" state. The first slew-rate control circuit 203 can include one or more enable transistors (M1, M2, M4, M5) responsive to a state of the control signal (CTRL). A first enable transistor (M1) of the first slew-rate control circuit 203 can couple the control node of the bypass transistor ($M_{BP}$) to the gate charge current source 211. A second enable transistor (M5) of the first slew-rate control circuit 203 can couple a sense transistor (Q2) of the current mirror 213 to the slew-rate control capacitor ($C_M$). Note that the sense transistor (Q2) of the current mirror 213 can couple the slew-rate control capacitor ($C_M$) with the control node of the bypass transistor ($M_{BP}$). A third enable transistor (M2) of the first slew-rate control circuit 203 can couple a mirror transistor (Q1) of the current mirror 213 with a reference voltage or supply rail. A fourth enable transistor (M4) of the first slew-rate control circuit 203 can couple the slew-rate control current source 212 with a control node of the sense transistor (Q2) of the current mirror 213. In certain examples, a diode (D) can couple the first slew-rate control circuit 203 with the control node of the bypass transistor ($M_{BP}$). For purposes of discussion, it can be assumed that before enabling of the bypass transistor ($M_{BP}$), the bypass transistor ($M_{BP}$) provides very high impedance between the conduction nodes, and the control node of the bypass transistor ($M_{BP}$) is pulled down to the reference voltage or supply voltage rail to which the source conduction node of the bypass transistor ($M_{BP}$) is coupled. In some examples, the reference voltage can be a supply voltage rail such as ground. In some examples, the reference voltage can be the voltage at the source node of the example NMOS bypass transistor ($M_{BP}$).

Upon receiving the "enable" state of the control signal (CTRL), and assuming the enable transistors (M1, M2, M4, M5) provide low-impedance connections as discussed above, the gate charge current source 211 can begin to charge the control node, or gate, of the bypass transistor ($M_{BP}$) and a gate-to-source voltage ($v_{gs}$) can begin to develop. For simplicity, assume the voltage drop across the diode (D) is close to Q2's emitter-to-base voltage, and bypass transistor (MBP) and beta helper M3 have similar turn on thresholds. As the gate-to-source voltage ($v_{gs}$) approaches the voltage of the Miller plateau of operation of the bypass transistor ($M_{BP}$), the slew-rate control capacitor ($C_M$), as well as, the sense transistor (Q2) of the current mirror 213, can begin to conduct current. When the bypass transistor ($M_{BP}$) enters the Miller plateau, the voltage across the conduction nodes (e.g., the drain-to-source voltage, $v_{ds}$) of the bypass transistor ($M_{BP}$) can begin to drop, and the voltage at the control node stays somewhat unchanged. At this point of operation, the current of the sense transistor (Q2) corresponds to an estimate of the current flow through the slew-rate control capacitor ($C_M$) and can be estimated as $$I_{Q2}=C_M \times d(Vds)/dt, \quad (Eq. 1)$$

where d(Vds)/dt is the slew rate or voltage change across the conduction nodes of the bypass transistor ($M_{BP}$). Since the mirror transistor (Q1) is matched to the sense transistor (Q2) by a gain (N), then, $$I_{Q1}=N \times I_{Q2} \times e^{I2 \times R1/Vt}, \quad (Eq. 2)$$

where vt is the threshold voltage of the bypass transistor ($M_{BP}$), and $e^{I2 \times R1/Vt}$ is the exponential gain factor from the control node offset voltage developed across the resistor (R1) coupling the control (base) nodes of the current mirror transistors (Q1, Q2) together and the current (I2) of the slew-rate control current source 212. Because the combined gain is somewhat large, $I_{Q2}+I_{Q1} \approx I_{Q1}$ in the Miller plateau, and the slew rate ($dV_{ds}/dt$) can be estimated at, $$\frac{dV_{ds}}{dt} = \frac{I1}{C_M} \times \frac{1}{Ne^{\frac{I2 \times R1}{Vt+1}}}, \quad (Eq. 3)$$

where $$\frac{dv}{dt} = \frac{I_1}{C} \cdot \frac{1}{Ne^{\left(\frac{I_2 R_1}{V_t}\right)+1}},$$

is the slew rate that would exist without the improved slew-rate control circuit and $Ne^{I2 \times R1/Vt}$ represents the scaling factor associated with the improved slew-rate control circuit when $Ne^{I2 \times R1/Vt} \gg 1$. In general, the sense transistor (Q2) can sense the slew rate in terms of current, and an amplified version of this current can be shunted away from charging the slew-rate control capacitor ($C_M$) via the mirror transistor (Q1). A perturbation on the desired slew rate can be corrected by shunting more current or less current via the mirror transistor (Q1). Thus, the process of charging the gate of the bypass transistor ($M_{BP}$) can operate in a closed-loop fashion. As an example, assume N=5. The slew rate with respect to I2×R1 is listed in Table 1. It can be observed that the linearly spaced input current I2 can change the slew rate of the bypass transistor ($M_{BP}$) exponentially.

TABLE 1

| I2xR1 | Slew Rate (V/μsec) |
|---|---|
| 0 mV | 5 |
| 18 mV | 10 |
| 36 mV | 20 |
| 54 mV | 40 |
| 60 mV | 50 |

TABLE 1-continued

| I2xR1 | Slew Rate (V/μsec) |
|---|---|
| 120 mV | 500 |
| 180 mV | 5000 |

When the voltage of the gate, or control node, of the bypass transistor ($M_{BP}$) ramps up beyond a first predefined reference (REFH) that is higher than a Miller plateau voltage ($V_{GP}$), the first latch circuit 207 can pin a voltage of a node of the slew-rate control capacitor ($C_M$) to the supply voltage ($V_{CC}$). The Miller plateau voltage ($V_{GP}$) can be a gate-to-source voltage of the bypass transistor ($M_{BP}$) indicative of the Miller plateau of the bypass transistor ($M_{BP}$). The Miller plateau voltage ($V_{GP}$) can represent a small range of voltages indicative of the Miller plateau. The first latch circuit 207 can include a comparator 220, a logic gate 221, a first switch (M11), and a second switch (M13). If the gate-to-source voltage of the bypass transistor ($M_{BP}$) is higher than the first predefined reference (REFH), the output of the comparator 220 can be logically combined (via a logical AND), via the logic gate 221, with the control signal (CTRL) and the resulting signal can trigger the first switch (M11) to latch a node of the slew-rate control capacitor ($C_M$) to a reference voltage ($V_{RR}$). The reference voltage ($V_{RR}$) can be referenced to the source node of the bypass transistor ($M_{BP}$) and can have a magnitude to place the connected node of the slew-rate control capacitor ($C_M$) near the gate voltage of the Miller region of the bypass transistor ($M_{BP}$). In certain examples, the reference voltage ($V_{RR}$) is about the sum of the threshold voltage of the bypass transistor ($M_{BP}$), the forward biased base-emitter voltage of the sense transistor (Q4), and the gate-to-source voltage, or threshold voltage, of the beta-helper transistor (M7). The second switch (M13) can receive the output of the logic gate 221 and can latch the gate of the bypass transistor ($M_{BP}$) to the supply voltage ($V_{CC}$) when the bypass transistor ($M_{BP}$) has been enabled and the voltage at the gate of the bypass transistor ($M_{BP}$) has risen to the first predefined reference (REFH).

In certain examples, the second slew-rate control circuit 206 can include a gate discharge current source 224, a slew-rate control current source 222, and a current mirror 223. The second slew-rate control circuit 206 can be enabled when the control signal (CTRL) goes to a "disable" or "low" state. The second slew-rate control circuit 206 can include one or more enable transistors (M9, M10, M6, M8) responsive to a state of the control signal (CTRL). A first enable transistor (M9) of the second slew-rate control circuit 206 can couple the control node of the bypass transistor ($M_{BP}$) to the gate discharge current source 224. A second enable transistor (M8) of the second slew-rate control circuit 206 can couple a sense transistor (Q4) of the current mirror 223 to the slew-rate control capacitor ($C_M$). Note that the sense transistor (Q4) of the current mirror 223 can couple the slew-rate control capacitor ($C_M$) with the control node of the bypass transistor ($M_{BP}$). A third enable transistor (M6) of the second slew-rate control circuit 206 can couple a mirror transistor (Q3) of the current mirror 223 with a supply voltage ($V_{CC}$). A fourth enable transistor (M10) of the second slew-rate control circuit 206 can couple the slew-rate control current source 222 with a control node of the sense transistor (Q4) of the current mirror 223. For purposes of discussion, it can be assumed that before disabling of the bypass transistor ($M_{BP}$), the bypass transistor ($M_{BP}$) provides very low impedance between the conduction nodes, and the control node of the bypass transistor ($M_{BP}$) has been pulled to the supply voltage ($V_{CC}$).

Upon receiving the "disable" state of the control signal (CTRL), and assuming the enable transistors (M9, M10, M8, M6) provide low-impedance connections as discussed above, the gate discharge current source 224 can begin to discharge the control node, or gate, of the bypass transistor ($M_{BP}$), and a gate-to-source voltage ($V_{GS}$) can begin to decrease. As the gate-to-source voltage ($V_{GS}$) approaches the Miller voltage ($V_{GP}$), indicative of the Miller plateau region of operation of the bypass transistor ($M_{BP}$), the slew-rate control capacitor ($C_M$), as well as the sense transistor (Q4) of the current mirror 233, can begin to conduct current. When the bypass transistor ($M_{BP}$) enters the Miller plateau, the voltage across the conduction nodes (e.g., the drain-to-source voltage, $V_{DS}$) can begin to rise, and the voltage at the control node stays somewhat unchanged. At this point of operation, the current of the sense transistor (Q4) is an estimate of the current flow through the slew-rate control capacitor ($C_M$) and can be estimated as $$I_{Q4}=C_M \times d(v_{ds})/dt, \quad \text{(Eq. 4)}$$

where $d(V_{DS})/dt$ is the slew rate or voltage change across the conduction nodes of the bypass transistor ($M_{BP}$). Since the mirror transistor (Q3) is matched to the sense transistor (Q4) by a gain (N), then, $$I_{Q3}=N \times I_{Q4} \times e^{I4 \times R3/Vt}, \quad \text{(Eq. 5)}$$

where vt is the threshold voltage of the bypass transistor ($M_{BP}$), and $e^{I4 \times R3/Vt}$ is the exponential gain factor from the control node offset voltage developed across a resistor (R3) coupling the control nodes of the current mirror transistors (Q3, Q4) together and the current (I4) of the slew-rate control current source 222. Because the combined gain is somewhat large, $I_{Q4}+I_{Q3} \approx I_{Q3}$ in the Miller plateau, and the slew rate ($dV_{ds}/dt$) can be estimated at, $$\frac{I1}{C_M}$$

where $$\frac{dV_{ds}}{dt} = \frac{I3}{C_M} \times \frac{1}{Ne^{\frac{I4 \times R3}{Vt+1}}}, \quad \text{(Eq. 6)}$$

would be slew rate without the improved slew-rate control circuit and $Ne^{I4 \times R3/Vt}$ can represent a scaling factor associated with the improved slew-rate control circuit when $Ne^{I4 \times R3/Vt} \gg 1$. In general, the sense transistor (Q4) can sense the slew rate in terms of current, and an amplified version of this current can be shunted away from charging the slew-rate control capacitor ($C_M$) via the mirror transistor (Q3). A perturbation on a desired the slew rate can be corrected by shunting more current or less current via the mirror transistor (Q3). Thus, the process of discharging the gate of the bypass transistor ($M_{BP}$) can operate in a closed-loop fashion.

In certain examples, when the potential of the gate, or control node, of the bypass transistor ($M_{BP}$) falls beyond a second predefined reference (REFL) that is lower than the Miller voltage ($V_{GP}$), the second latch circuit 208 can pin a node of the slew-rate control capacitor ($C_M$) to a reference voltage, such as the lower supply rail, such as ground. The second latch circuit 208 can include a comparator 230, a logic gate 231, a first switch (M12), and a second switch (M14). If the gate-to-source voltage of the bypass transistor ($M_{BP}$) is lower than the second predefined reference (REFL), the output of the comparator 230 can be combined using a logical AND, via the logic gate 231, with the control signal (CTRL) and the resulting signal can trigger the first switch (M12) to latch a node of the slew-rate control capacitor ($C_M$) to the source node of the bypass transistor ($M_{BP}$). In certain examples, the second switch (M14) can receive the output of the logic gate 231 and can latch the gate of the bypass transistor ($M_{BP}$) to the source node of the bypass transistor ($M_{BP}$) when the bypass transistor ($M_{BP}$) has been disabled and the voltage at the gate of the bypass transistor ($M_{BP}$) has fallen to the second predefined reference (REFL).

Each of the first and second slew-rate control circuits 203, 206 can include a corresponding beta-helper transistor (M3, M7). The beta-helper transistors (M3, M7) can help provide base current for the bipolar-junction mirror transistors (Q1, Q3) of each of the corresponding current mirrors 213, 223. The base current for the mirror transistors (Q1, Q3) can become quite large because of the programming of the base of the corresponding sense transistor (Q2, Q4) and the current amplification effect thereof. For example, if the base current for the mirror transistor (Q1, Q3) is only provided via the corresponding gain resistor (R1, R3), the control node offset voltage can change significantly as the bypass transistor ($M_{BP}$) transitions through the Miller plateau. Therefore, the beta-helper transistors (M3, M7) can help provide base current for the corresponding mirror transistor (Q1, Q3) such as to help maintain the control node offset voltage between the control node of the mirror transistor (Q1, Q3) and the control node of the corresponding sense transistor (Q2, Q4).

Figure 3:
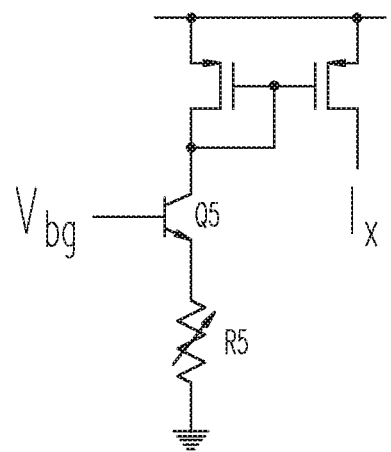
FIG. 3 illustrates generally an example adjustable current source for providing programmable current to set the control node offset voltage of the example circuits of FIG. 1 and FIG. 2.

FIG. 3 illustrates generally an example adjustable current source for providing programmable current ($I_X$) to set the control node offset voltage of the example circuits of FIG. 1 and FIG. 2. The adjustable current source can include an input transistor (Q5), a variable resistor such as, but not limited to, a digitally programmed resistor (R5), and a current mirror. In certain examples, a bandgap or other suitable voltage reference voltage can be applied to the control node of the input transistor (Q5) such as to develop, for example, a proportional-to-absolute-temperature (PTAT) voltage across the digitally programmed resistor (R5). If matching resistors are used for the resistor coupling the control nodes of the current mirror transistors of the slew-control circuits and (R5), then the exponential gain factor (e.g., Eq. 2, Eq. 5) can be substantially independent of temperature and process variation. In certain examples, the adjustable resistor is a digitally controlled resistor and can be programmed by a slew-rate control word as a digital input, either directly from a serial communication port or converted from an analog input signal.

Figure 4A:
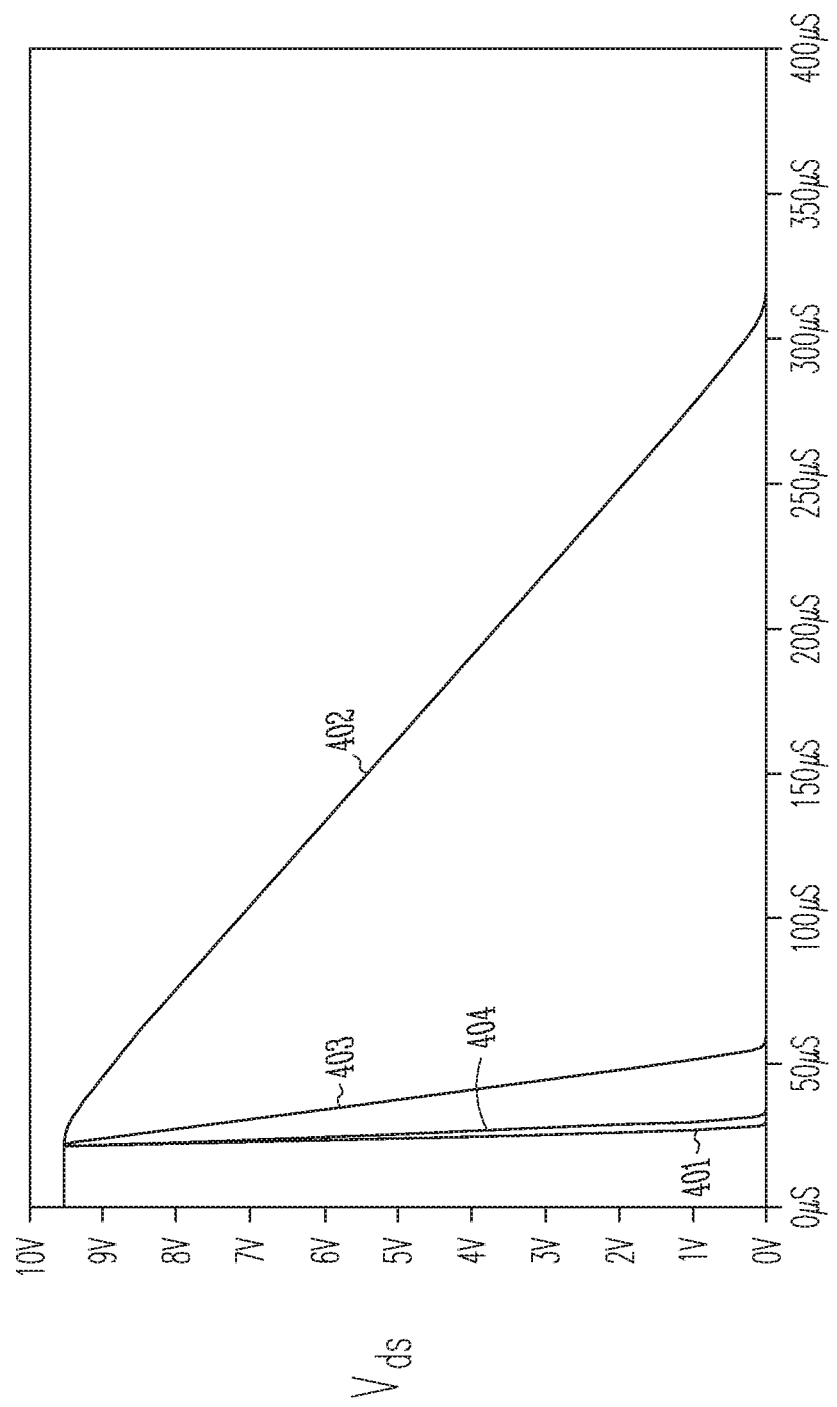
FIGS. 4A and 4B illustrate graphically the range of voltage slew rates that can be achieved using a slew-rate control circuit according to the present subject matter.
Figure 4B:
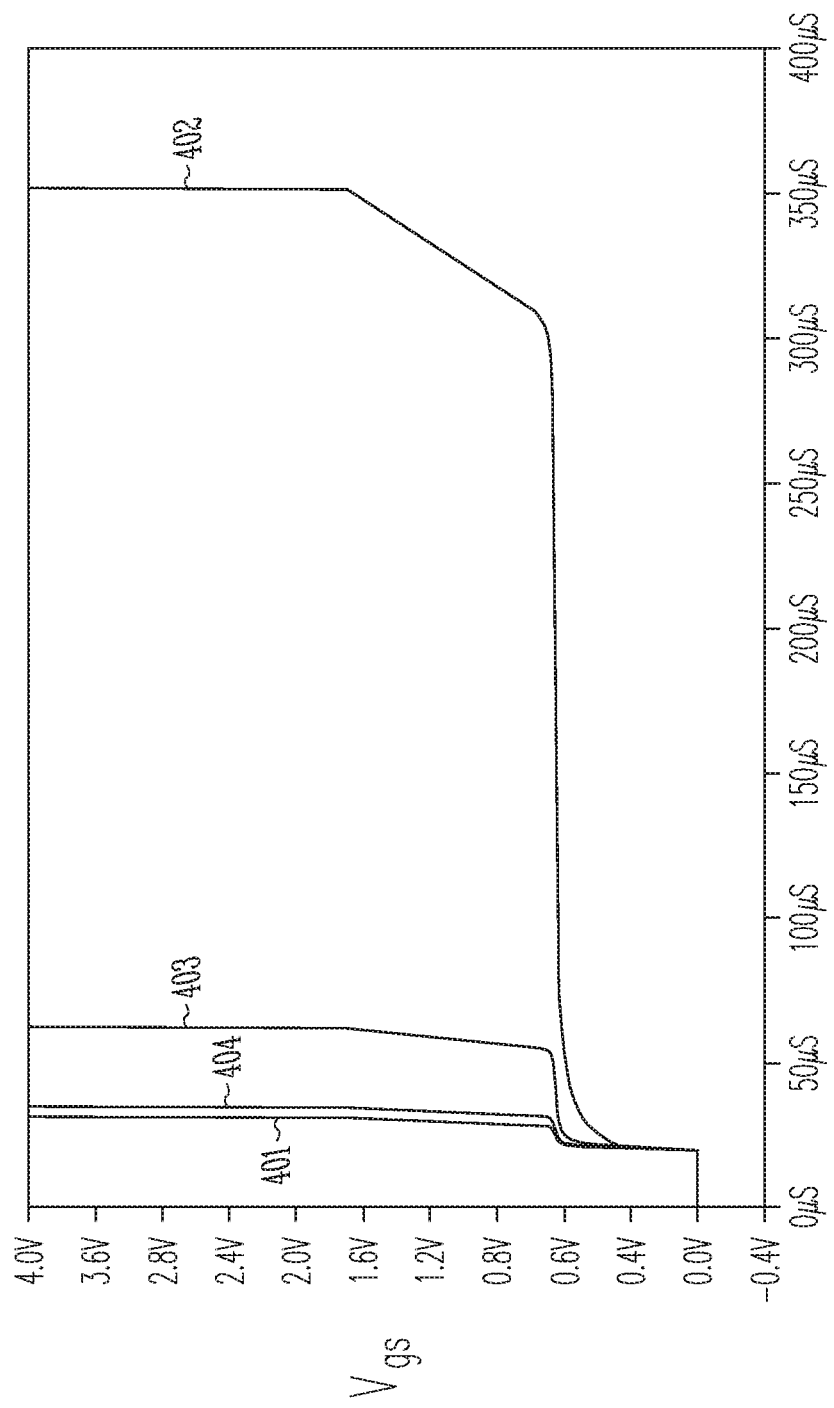

FIGS. 4A and 4B are computer simulation transient plots that illustrate graphically the range of voltage slew rate that can be achieved using a slew-rate control circuit according to the present subject matter. FIG. 4A shows the voltage change of the conduction nodes of a bypass transistor over time as the bypass transistor is enabled using an example slew-rate control circuit and for a range (0 to XmV) of different control node voltage offsets. FIG. 4B shows the gate-to-source voltage of a bypass transistor over time as the bypass transistor is enabled using the example slew-rate control circuit and for the range (0 to XmV) of different control node voltage offsets. In an example, X can be about 120 mV. A first plot 401 shows the slew rate and $v_{gs}$ for 0 volts voltage offset between the control nodes of the current mirror transistors of the slew-rate control circuit. A second plot 402 shows characteristics for a control node offset voltage of X mV. A third plot 403 shows characteristics for a control node offset voltage of 0.5X mV. A fourth plot 404 shows characteristics for a control node offset voltage of 0.15X mV. The simulation results show that for a control node offset voltage changing by a factor of 2 (e.g. 30 mV→120 mV) the slew rate can change by a factor of 10 (e.g., 25 μs→250 μs).

Figure 5:
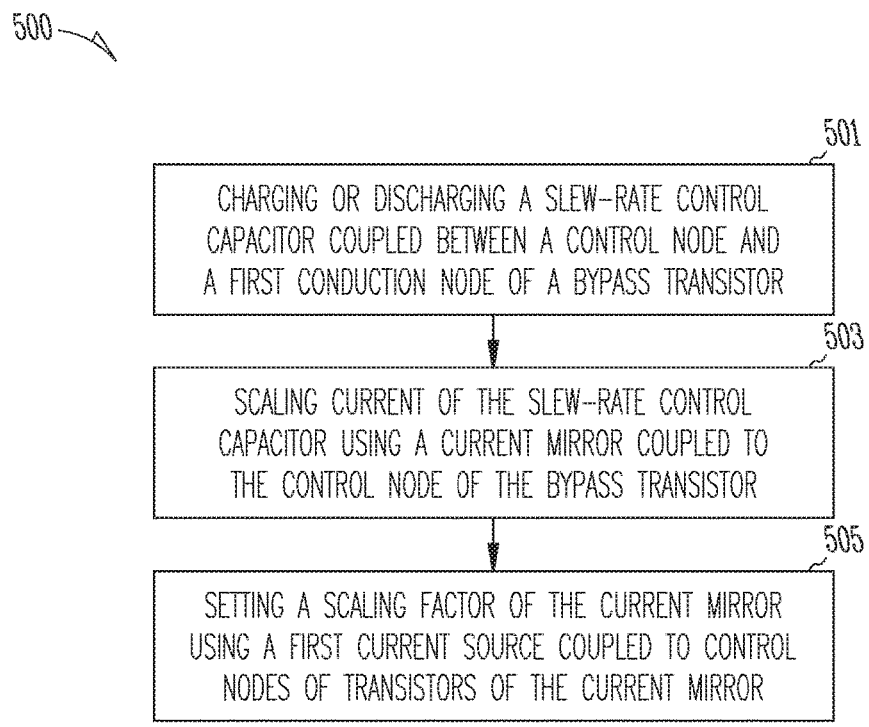
FIG. 5 illustrates an example method of controlling a voltage slew rate across conduction nodes of a bypass transistor configured to selectively divert current from a load.

FIG. 5 illustrates an example method 500 of limiting a voltage slew rate across conduction nodes of a bypass transistor configured to selectively divert current from a load. At 501, as the bypass transistor is enabled or disabled, a slew-rate control capacitor coupled between a conduction node of the bypass transistor and a control node of the bypass transistor can be charged or discharged. In certain examples, current of the slew-rate control capacitor can by sensed by a sense transistor of a current mirror. At 503, the current of the slew-rate control capacitor can be scaled using the current mirror, and the current mirror can dump current to a control node of the bypass transistor, or divert current from the control node of the bypass transistor, to slew to a voltage drop, or a voltage rise, across the conduction nodes of the bypass transistor as the bypass transistor transitions between states to selectively divert, or not divert, current from the load. At 505, a scaling factor of the current mirror can be set using a current source coupled to control node of transistors of the current mirror. The current source can include a resistor coupling the control nodes together and can establish a control node voltage offset between the coupled control nodes. In certain examples, a linear change in the control node voltage offset can result in an exponential change in the slew rate of the voltage across the conduction nodes of the bypass transistor.

In certain examples, a slew-compensation control circuit according to the present subject matter can employ a bipolar device current mirror with a programmable base-emitter voltage offset to multiply current provided by a small Miller capacitor or slew rate control capacitor ($C_M$). Such a circuit is area efficient as it can use a small-value integrated capacitance for the slew-rate control capacitor ($C_M$) (e.g., eliminating any need for an external slew-rate capacitor), a small number of transistors, and a resistor network to program the gain. In addition, the programmed slew-rate takes effect as the gate-to-source voltage ($v_{gs}$) of the bypass transistor enters the Miller region or Miller plateau and not as the gate-to-source voltage ($v_{gs}$) begins to leave the Miller region or Miller plateau.

For reference, the Miller plateau can be observed in the waveform of the gate to source voltage during the turn-on and turn-off of a MOS transistor by applying a rectangular waveform. The plateau of the gate-to-source voltage over time ($V_{gs}(t)$) occurs at the rise or the fall time of the drain-to-source voltage ($V_{ds}(t)$), or where the MOS transistor turns on from off or vice versa. Charging the intrinsic gate-to-drain capacitance ($C_{gd}$) or another gate-to-drain capacitance (e.g., Miller capacitor) during turn on of the transistor and discharging it during turn-off of the transistor causes the Miller plateau. The charging or discharging time of the gate of the bypass transistor may be determined by the amount and timing of current delivered to or from the gate of the bypass transistor by a gate driver.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A slew-rate controlled load bypass circuit arranged to be coupled to a load via first and second conduction nodes of a bypass transistor, the load bypass circuit comprising:
    a capacitor electrically coupled between the first conduction node of the bypass transistor and a control node of the bypass transistor; and a current mirror circuit including:
    a first transistor electrically coupled in series with the capacitor and the control node; and
    a second transistor electrically coupled between a power supply and the control node to selectively provide, to or from the control node, a current that bypasses the capacitor to limit a slew rate of a voltage across the first conduction node and the second conduction node of the bypass transistor.

2. The slew-rate controlled load bypass circuit of claim 1, including a first current source coupled to a control node of the first transistor and to a control node of the second transistor and configured to set a gain of the current mirror circuit.

3. The slew-rate controlled load bypass circuit of claim 2, wherein the gain is configured to amplify a capacitive effect of the capacitor.

4. The slew-rate controlled load bypass circuit of claim 2, wherein the first current source is adjustable.

5. The slew-rate controlled load bypass circuit of claim 2, including a beta helper transistor having a first node coupled to the power supply, a second node coupled to the control node of the second transistor and a control node coupled to the capacitor.

6. The slew-rate controlled load bypass circuit of claim 2, including a resistor configured to couple the control node of the first transistor with the control node of the second transistor.

7. The slew-rate controlled load bypass circuit of claim 6 including a second current source coupled between the power supply and the control node of the bypass transistor.

8. The slew-rate controlled load bypass circuit of claim 7, wherein a change of voltage (dv/dt) across the first and second conduction nodes of the bypass transistor is given by:

$$\frac{I3}{C_M}$$

where I1 is a current of the second current source, I2 is a current of the first current source, R1 is a resistance of the first resistor, C is a capacitance of the capacitor, N is the gain of the current mirror circuit, and $v_t$ is a threshold voltage of the bypass transistor.

9. A method of controlling a voltage slew rate of a load bypass circuit, the method comprising:
    charging or discharging a capacitor coupled between a control node and a first conduction node of a bypass transistor of the load bypass circuit;
    scaling current of the capacitor using a current mirror coupled to the control node of the bypass transistor;

setting a scaling factor of the current mirror using a first current source coupled to control nodes of transistors of the current mirror; and wherein the scaling factor of the current mirror is configured to amplify a capacitive effect of the capacitor and to control the voltage slew rate across the first conduction node and a second conduction node of the bypass transistor.

10. The method of claim 9, wherein setting a scaling factor of the current mirror includes developing an offset voltage between a control node of a first transistor of the current mirror and a control node of a second transistor of the current mirror.

11. The method of claim 10, wherein developing an offset voltage includes developing the offset voltage across a resistor configured to couple the control node of the first transistor with the control node of the second transistor.

12. The method of claim 11, wherein the developing an offset voltage further includes passing current of the first current source through the resistor.

13. The method of claim 12, wherein the first current source is an adjustable current source.

14. The method of claim 9, including charging or discharging a gate using a corresponding second current source coupled between a power supply and a gate of the bypass transistor;

wherein the scaling current of the capacitor using the current mirror coupled to the control node of the bypass transistor includes:

sensing the current of the capacitor via a first transistor of the current mirror, the first transistor coupled between the capacitor and the gate of the bypass transistor; and modulating current of the gate of the bypass transistor and current of the corresponding second current source using a second transistor of the current mirror.

15. The method of claim 14, including supplying base current of the second transistor using a third transistor having a first node coupled to the power supply, a second node coupled to a control node of the second transistor, and a control node coupled to the capacitor.

16. A system comprising:

a load configured to receive power from a supply, and a current bypass circuit coupled to the load, the current bypass circuit configured to selectively divert current from the load and to control change of voltage across the current bypass circuit at the load when an amount of diverted current changes;

wherein the current bypass circuit comprises:

a load bypass transistor, including first and second conduction nodes, arranged to be coupled to the load, and a control node to control conduction between the first and second conduction nodes;

a capacitor, electrically coupled between the first conduction node and the control node of the load bypass transistor; and a first current mirror circuit, including a second transistor electrically coupled in series with the capacitor and the control node, and a third transistor electrically coupled between a rail of the supply and the control node to selectively provide, to or from the control node, a first current that bypasses the capacitor to limit a change of a voltage across the first and second conduction nodes.

17. The system of claim 16, wherein the load is a matrix of light-emitting diodes (LEDs).

18. The system of claim 17, wherein the load bypass transistor is coupled across a subset of LEDs of the matrix of LEDs.

19. The system of claim 16, wherein the load is a module configured for hot swap replacement.

20. The system of claim 16, wherein the first current mirror circuit is configured to control a first slew rate of the voltage across the first and second conduction nodes when the load bypass transistor enters a low impedance mode of operation;

wherein the current bypass circuit further comprises a second current mirror circuit configured to control a second slew rate of the voltage across the first and second conduction nodes when the load bypass transistor enters a high impedance mode of operation;

wherein the third transistor is configured to selectively provide to the control node, the first current that bypasses the capacitor to limit the first slew rate of the voltage across the first and second conduction nodes; and wherein the second current mirror circuit includes:

a fourth transistor electrically coupled in series with the capacitor and the control node; and a fifth transistor electrically coupled between the rail and the control node to selectively provide from the control node, a second current that bypasses the capacitor to limit the second slew rate of the voltage across the first and second conduction nodes.

* * * * *